United States Patent
Nuki

(10) Patent No.: US 7,944,695 B2
(45) Date of Patent: May 17, 2011

(54) MOTOR CONTROLLER

(75) Inventor: Koji Nuki, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 124 days.

(21) Appl. No.: 12/440,251

(22) PCT Filed: Aug. 24, 2007

(86) PCT No.: PCT/JP2007/066419
§ 371 (c)(1),
(2), (4) Date: Mar. 6, 2009

(87) PCT Pub. No.: WO2008/029638
PCT Pub. Date: Mar. 13, 2008

(65) Prior Publication Data
US 2010/0039776 A1    Feb. 18, 2010

(30) Foreign Application Priority Data
Sep. 7, 2006 (JP) ................... 2006-242544

(51) Int. Cl.
H05K 7/20 (2006.01)
(52) U.S. Cl. ........ 361/703; 361/704; 361/707; 257/718; 165/80.3
(58) Field of Classification Search .................. None
See application file for complete search history.

(56) References Cited

U.S. PATENT DOCUMENTS

| | | | | |
|---|---|---|---|---|
| 5,497,289 A | * | 3/1996 | Sugishima et al. | 361/709 |
| 5,598,322 A | * | 1/1997 | Von Arx et al. | 361/704 |
| 6,320,776 B1 | * | 11/2001 | Kajiura et al. | 363/141 |
| 6,501,662 B2 | * | 12/2002 | Ikeda | 361/760 |
| 6,667,882 B2 | * | 12/2003 | Pauser | 361/695 |
| 6,704,202 B1 | * | 3/2004 | Hamaoka et al. | 361/704 |
| 6,891,725 B2 | * | 5/2005 | Derksen | 361/704 |
| 6,903,936 B2 | * | 6/2005 | Lin | 361/752 |
| 7,206,204 B2 | * | 4/2007 | Nakatsu et al. | 361/703 |
| 7,272,009 B2 | * | 9/2007 | Sura et al. | 361/719 |
| 7,280,362 B2 | * | 10/2007 | Hood et al. | 361/719 |
| 2004/0124722 A1 | * | 7/2004 | Uchida et al. | 310/54 |
| 2006/0203453 A1 | * | 9/2006 | Chen | 361/704 |

FOREIGN PATENT DOCUMENTS

JP    3020103 U    10/1995

(Continued)

OTHER PUBLICATIONS

Taiwanese Office Action, Application No. 096133255, dated Jun. 17, 2010, 3 pages. Taiwanese Office Action issued in Application No. 9920694180, dated Sep. 29, 2010.

*Primary Examiner* — Boris L Chervinsky
(74) *Attorney, Agent, or Firm* — Sughrue Mion, PLLC

(57) ABSTRACT

A motor controller which is inexpensive and has high cooling performance by using an extrusion heat sink (1), reducing the number of parts, and reducing the man-hours of assembling is provided. In a motor controller including an extrusion heat sink (1), and a power semiconductor module (4) including a plurality of external electrode terminals which closely contact the extrusion heat sink (1), and a printed circuit board having the plurality of external electrode terminals connected thereto, die-casting frames (2) in which a pedestal (2a) for attaching a motor controller and bosses (2b) for attaching a printed circuit board are molded are provided at both ends of the extrusion heat sink (1).

7 Claims, 5 Drawing Sheets

FOREIGN PATENT DOCUMENTS

| | | |
|---|---|---|
| JP | 10-261883 A | 9/1998 |
| JP | 11-031771 A | 2/1999 |
| JP | 2002-043479 A | 2/2002 |
| JP | 2004-022815 A | 1/2004 |
| JP | 2004-349548 A | 12/2004 |
| JP | 2005-236156 A | 9/2005 |
| TW | 254656 M | 4/1993 |
| TW | 200612810 A | 10/1993 |

* cited by examiner

MOTOR CONTROLLER

TECHNICAL FIELD

The present invention relates to a motor controller, such as an inverter device or a servo amplifier, which operates mainly by a high-voltage power supply, and particularly, to a heat sink for enhancing the radiating effect of a motor controller.

RELATED ART

A conventional motor controller, for example, an inverter device is mounted with a plurality of power semiconductor modules that are heat-generating parts, and is mounted with a heat sink for cooling the plurality of power semiconductor modules (for example, refer to Patent Document 1). The configuration of a conventional motor controller, for example, an inverter device, is shown in FIGS. 7 to 9.

FIG. 7 is an exploded perspective view showing a conventional motor controller using a die-casting heat sink.

In FIG. 7, a pedestal 101a for attaching a motor controller to a control panel, bosses 102b for attaching a printed circuit board (PCB), and ratches 101c for attaching a plastic case are integrally molded with a die-casting heat sink 101. The die-casting heat sink 101 is mounted with a power semiconductor module 102 including IGBT (Insulated Gate Bipolar Transistor) elements which generate high heat. The heat of the power semiconductor module 102 is transferred to and radiated to the die-casting heat sink 101. A printed circuit board 103 is fixed to the bosses 101b for attaching a printed circuit board, which are integrally molded with the die-casting heat sink 101, with screws 104, and is electrically connected to the power semiconductor module 102. Further, a plastic case 105 is attached to the die-casting heat sink 101 by tightening screws 110 of the plastic case 105 to the screw holes 101c for fixing a plastic case, of the die-casting heat sink 101. A motor controller is attached to the control panel (not shown) by the pedestal 101a of the die-casting heat sink 101.

In the die-casting heat sink, it is difficult to make the pitch of fins small due to limitations in manufacture. Therefore, fins with a narrow pitch of 8 mm or less cannot be molded. Therefore, heat-radiating area cannot be increased beyond a certain value, and there is a limitation to cooling performance. As a heat sink with enhanced cooling performance, a heat sink molded of an aluminum extruded material, or a caulking heat sink in which flat-plate-shaped fins are fixed to a base of the heat sink, which is molded by extrusion, by caulking is used. This makes it possible to narrow the pitch of fins to about 4 mm, thereby increasing the radiating area. Hereinafter, the heat sink will be referred to as an extrusion heat sink.

In recent years, since a small-sized and high-efficient heat sink is required for miniaturization of a motor controller, the extrusion heat sink is frequently used.

FIG. 8 shows a conventional motor controller, for example, inverter device, using an extrusion heat sink. Further, FIG. 9 is a detail view showing an attachment configuration of the heat sink in FIG. 8.

Since the extrusion heat sink has a constant cross-sectional shape in terms of manufacture, it is difficult to form a complicated shape. Therefore, this heat sink has a configuration different from the conventional motor controller using the die-casting heat sink 101 shown in FIG. 7.

In FIGS. 8 and 9, an extrusion heat sink 106 is attached to a heat sink case 107, which is made of resin or sheet metal, with screws 108. The heat sink case 107 has a pedestal portion 107a for attaching a motor controller to a control panel. The extrusion heat sink 1 is mounted with a power semiconductor module 102 which generates high heat. Further, studs 109 are attached to the extrusion heat sink, and a printed circuit board 103 is fixed to the studs 109 with the screws 104. The printed circuit board 103 is electrically connected to the power semiconductor module 102. Further, the plastic case 105 is attached to the heat sink case 107 by tightening the screws 110 of the plastic case 105 to screw holes 107c for fixing a plastic case, of the heat sink case 107.

Since cooling performance improves by using the extrusion heat sink 106, it is possible to miniaturize the heat sink, and it is possible to contribute to miniaturization of a whole motor controller.

Patent Document 1: JP-A-2004-349548

DISCLOSURE OF THE INVENTION

Problems to be Solved by the Invention

However, when the extrusion heat sink is used for a conventional motor controller, there are the following problems.

That is, since the extrusion heat sink has a constant cross-sectional shape in terms of manufacture, it is difficult to form a complicated shape. Accordingly, a pedestal for attaching a motor controller, bosses for fixing a printed circuit board, and ratches for fixing a plastic case cannot be integrally molded like the die-casting heat sink. When the extrusion heat sink is machined, and its shape is reproduced, machining cost becomes excessively high. Therefore, it is necessary to attach a case which fixes the extrusion heat sink or studs which fix a printed circuit board, or plastic case fixing screws. Since the number of parts increases, the cost of parts increases, the man-hours of assembling also increase, and the cost of the whole motor controller increases.

The invention has been made in view of such problems, and an object of the invention is to provide a motor controller which is inexpensive and has high cooling performance by using an extrusion heat sink, reducing the number of parts, and reducing the man-hours of assembling.

Means for Solving the Problems

In order to solve the above problems, the invention is configured as follows.

In an aspect of the invention, there is provided a motor controller including:

an extrusion heat sink, a power semiconductor module including a plurality of external electrode terminals which closely contact the extrusion heat sink, and a printed circuit board having the plurality of external electrode terminals connected thereto, characterized in that die-casting frames are provided at both ends of the extrusion heat sink.

More specifically, there is provided the motor controller, characterized in that the die-casting frames comprise a pedestal for attaching a motor controller, and bosses for attaching a printed circuit board.

More specifically, there is provided the motor controller, characterized in that the die-casting frames are attached to the extrusion heat sink by press fitting or caulking.

More specifically, there is provided the motor controller, characterized in that the die-casting frames and a plastic case are provided with engaging portions for attaching the plastic case to the die-casting frames.

More specifically, there is provided the motor controller, characterized in that the engaging portions are ratches provided in the die-casting frames and attaching holes provided in the plastic case.

More specifically, there is provided the motor controller, characterized in that the die-casting frames to be applied to a plurality of models of motor controllers are made into a common shape.

More specifically, there is provided the motor controller, characterized in that the die-casting frames are made into a shape common to motor controllers whose heights are equal and whose widths are different.

EFFECTS OF THE INVENTION

In the present invention, die-casting frames in which bosses for attaching a printed circuit board and a pedestal for attaching a motor controller are integrally molded are provided on both sides of the extrusion heat sink. Thereby, it is possible to reduce the number of parts, and it is possible to reduce the man-hours of assembling, thereby reducing costs.

In an enhancement, screws are not used for attachment of the extrusion heat sink and the die-casting frames. Therefore, it is possible to reduce the number of parts, and it is possible to reduce the man-hours of assembling, thereby reducing costs.

In another enhancement, the plastic case and the die-casting frames are attached together without using screws or the like. Therefore, it is possible to reduce the number of parts, and it is possible to reduce the man-hours of assembling, thereby reducing costs.

In another enhancement, it is possible to share parts by making the die-casting frame into a common shape, and it is possible to reduce the kinds of parts and lower the unit price of parts.

Further, in another enhancement, motor controllers which differs in capacity, it is possible to share the die-casting frames, it is possible to reduce the kinds of parts through products series, and it is possible to increase the number of die-casting frames manufactured, thereby reducing costs.

Figure 1:
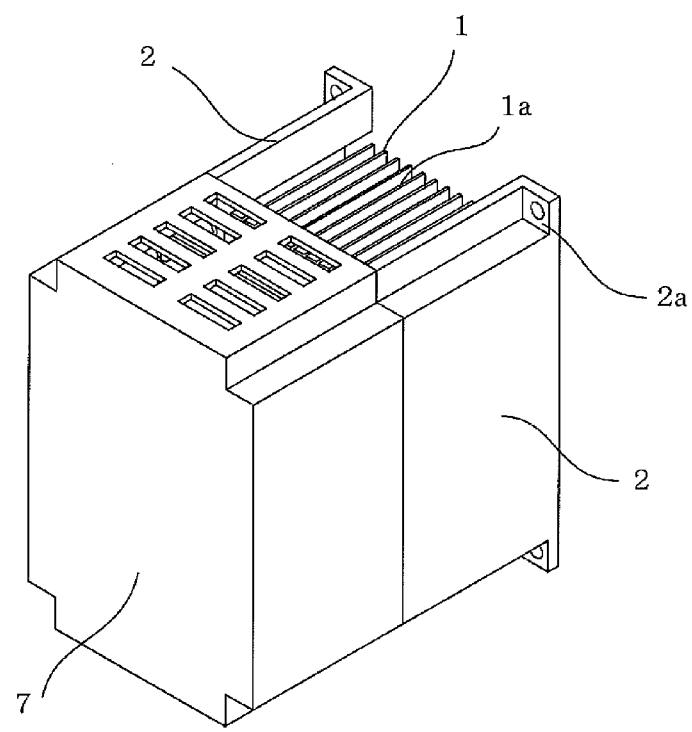
FIG. 1 is a perspective view of a motor controller showing a first embodiment of the invention.

REFERENCE NUMERALS 1, 106: EXTRUSION HEAT SINK
1a: FIN
2: DIE-CASTING FRAME
2a, 101a, 107a: PEDESTAL
2b, 101b: BOSS
2c: RATCH
3, 6, 104, 108, 110: SCREW
4, 102: POWER SEMICONDUCTOR MODULE
5, 103: PRINTED CIRCUIT BOARD
7, 105: PLASTIC CASE
7a, 105a: ATTACHING HOLE
101: DIE-CASTING HEAT SINK
101c, 107C: SCREW HOLE
107: HEAT SINK CASE
109: STUD

BEST MODE FOR CARRYING OUT THE INVENTION

Hereinafter, preferred embodiments of the invention will be described with reference to the accompanying drawings.

Embodiment 1

Figure 2:
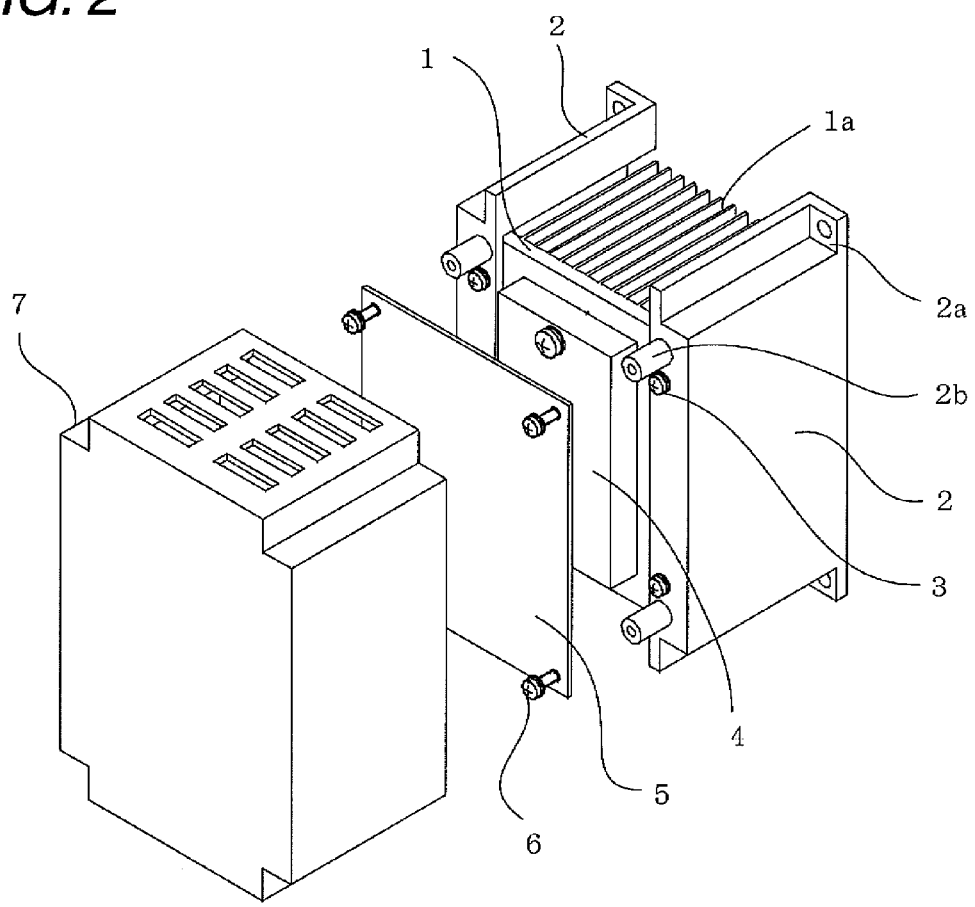
FIG. 2 is an exploded perspective view of the motor controller in FIG. 1.
Figure 3:
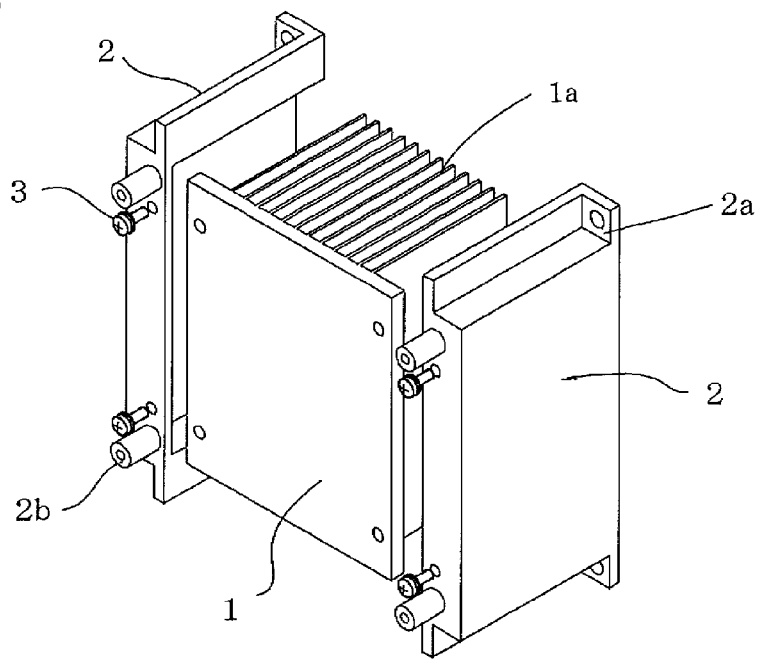
FIG. 3 is an exploded perspective view of a heat sink portion in FIG. 2.

FIG. 1 is a perspective view of a motor controller showing a first embodiment of the invention. FIG. 2 is an exploded perspective view of the motor controller in FIG. 1. FIG. 3 is a detail view showing an attachment structure of a heat sink and die-casting frames in FIG. 1.

In FIGS. 1 to 3, an extrusion heat sink 1 is formed with fins 1a, and a surface opposite to the fins is a flat surface. The fins 1a are integrally molded by extrusion, or are attached by caulking. Die-casting frames 2 are fixed to both ends of the extrusion heat sink 1 with screws 3. A pedestal 2a for attaching a motor controller to a control panel and bosses 2b for attaching a printed circuit board are integrally molded with each die-casting frame 2. A power semiconductor module 4 is mounted on a flat surface portion of the extrusion heat sink 1. The heat of the power semiconductor module 4 is transferred to and radiated to the extrusion heat sink 1. A printed circuit board 5 is fixed to the bosses 2b for attaching a printed circuit board, which are integrally molded with the die-casting frames 2, with screws 6, and is electrically connected to the power semiconductor module 4. Further, a plastic case 7 is fixed with screws or the like. A motor controller is attached to the control panel by the pedestals 2a integrally molded with the die-casting frames 2.

The invention is different from the conventional technique in that the die-casting frames 2 are provided on both sides of the extrusion heat sink 1. By integrating members for attaching a printed circuit board and pedestal parts for attaching a motor controller, which are required for a motor controller using an extrusion heat sink, in the die-casting frames 2, the number of parts can be reduced and the man-hours of assembling can be reduced. Thereby, it is possible to reduce costs. Further, since the die-casting frames 2 receive heat from the extrusion heat sink 1 and contribute to heat radiation, the effect of improvements in heat radiation capability is obtained.

Embodiment 2

Figure 4:
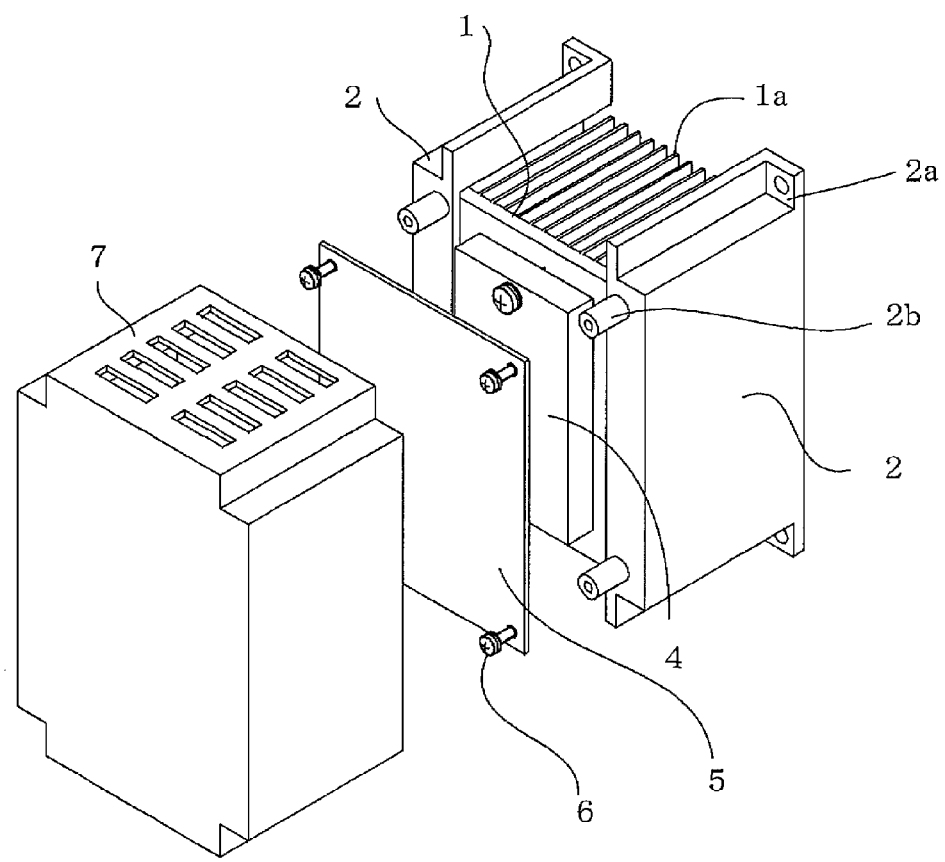
FIG. 4 is an exploded perspective view of a motor controller showing a second embodiment.

FIG. 4 is an exploded perspective view showing a motor controller of a second embodiment.

In FIG. 4, an extrusion heat sink 1 is formed with fins 1a, and a surface opposite to the fins 1a is a flat surface. The fins 1a are integrally molded by extrusion, or are attached by caulking. Die-casting frames 2 are fixed to both ends of the extrusion heat sink 1 by press fitting or caulking. A pedestal 2a for attaching a motor controller to a control panel and bosses 2b for attaching a printed circuit board are integrally molded with each die-casting frame 2. A power semiconductor module 4 is mounted on a flat surface portion of the extrusion heat sink 1. The heat of the power semiconductor module 4 is transferred to and radiated to the extrusion heat sink 1. A printed circuit board 5 is fixed to the bosses 2b for attaching a printed circuit board, which are integrally molded with the die-casting frames 2, with screws 6, and is electrically connected to the power semiconductor module 4. Further, a plastic case 7 is fixed with screws or the like. A motor controller is attached to the control panel by the pedestals 2a integrally molded with the die-casting frames 2.

This embodiment is different from Embodiment 1 in that screws are not used for attachment of the extrusion heat sink 1 and the die-casting frames 2. Thereby, it is possible to reduce the number of parts, and it is possible to reduce the man-hours of assembling, thereby reducing costs.

Embodiment 3

Figure 5:
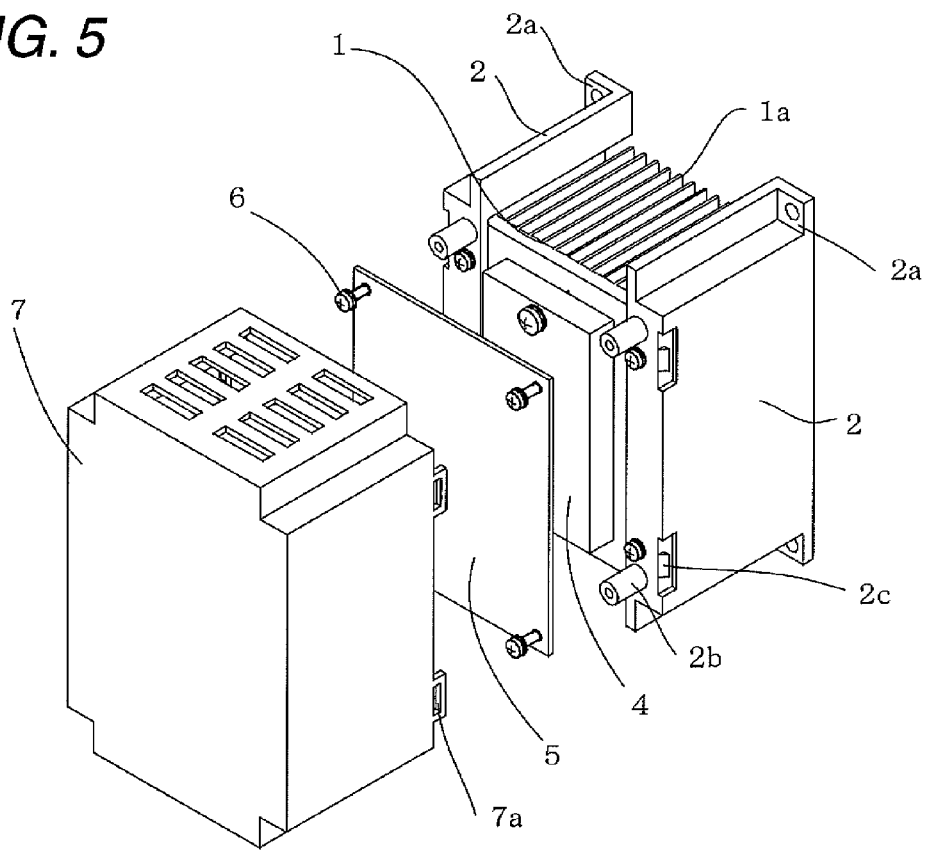
FIG. 5 is an exploded perspective view of a motor controller showing a third embodiment.

FIG. 5 is an exploded perspective view showing a motor controller of a third embodiment.

In FIG. 5, an extrusion heat sink 1 is formed with fins 1a, and a surface opposite to the fins is a flat surface. The fins 1a are integrally molded by extrusion, or are attached by caulking. Die-casting frames 2 are fixed to both ends of the extrusion heat sink 1 by press fitting or caulking. A pedestal 2a for attaching a motor controller to a control panel, bosses 2b for attaching a printed circuit board, and ratches 2c for attaching a plastic case are integrally molded with each die-casting frame 2. A power semiconductor module 4 is mounted on a flat surface portion of the extrusion heat sink 1. The heat of the power semiconductor module 4 is transferred to and radiated to the extrusion heat sink 1. A printed circuit board 5 is fixed to the bosses 2b for attaching a printed circuit board, which are integrally molded with the die-casting frames 2, with screws 6, and is electrically connected to the power semiconductor module 4. Further, a plastic case 7 is attached to the die-casting frames 2. At this time, the ratches 2c integrally molded with the die-casting frames 2 and attaching holes 7a of the plastic case 7 are fitted together using the elasticity of resin. A motor controller is attached to the control panel by the pedestals 2a integrally molded with the die-casting frames 2.

This embodiment is different from Embodiment 1 and Embodiment 2 in that screws are not used for fixation of the plastic case 7 by directly attaching the plastic case 7 to the ratches 2c of the die-casting frames 2. Thereby it is possible to reduce the number of parts, and it is possible to reduce the man-hours of assembling, thereby reducing costs.

Embodiment 4

In FIG. 5, two die-casting frames are used. By forming these two pieces in the same shape, sharing of parts is enabled. Since this reduces the kinds of parts and increases the number of the die-casting frames 2 manufactured, the cost of parts can be reduced. Further, since the kinds of parts are reduced, the effect that assemblability improves is also obtained.

Embodiment 5

Figure 6:
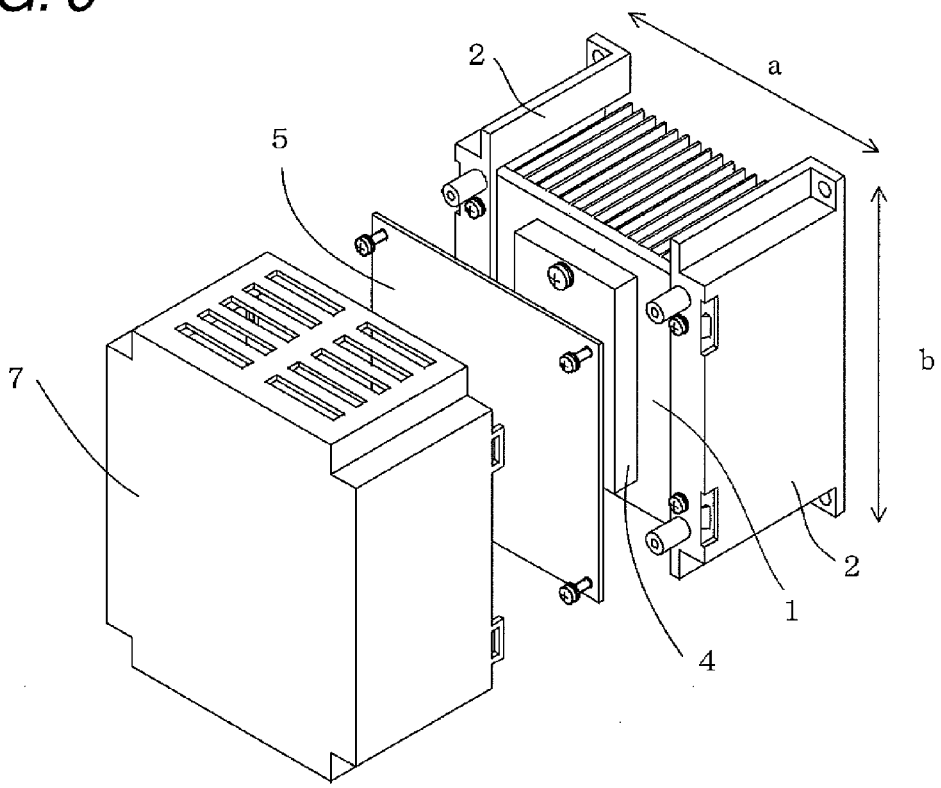
FIG. 6 is an exploded perspective view of a motor controller showing a fifth embodiment.
Figure 7:
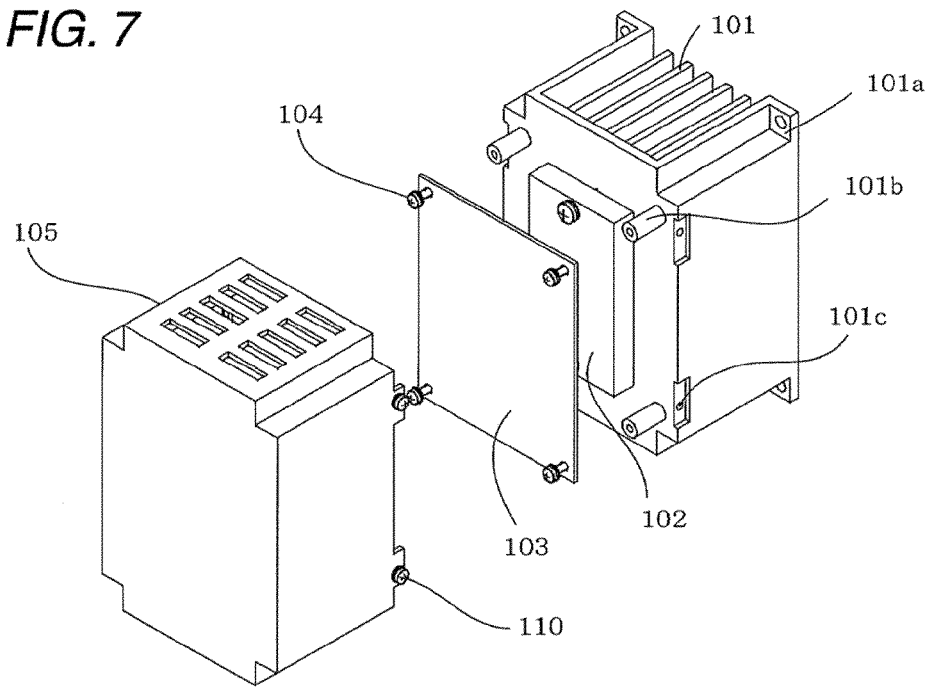
FIG. 7 is an exploded perspective view showing a conventional motor controller using a die-casting heat sink.
Figure 8:
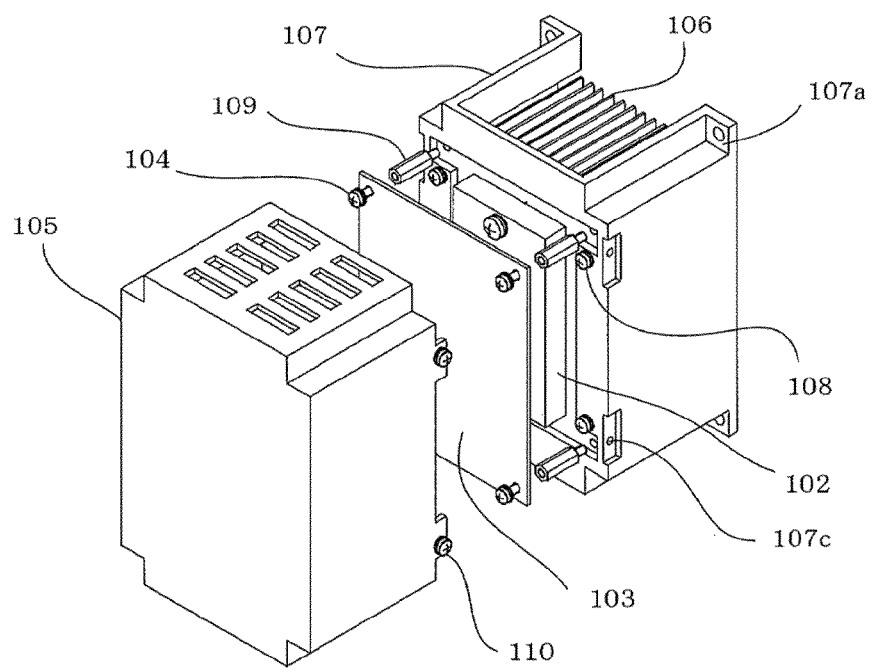
FIG. 8 is an exploded perspective view showing a conventional motor controller using an extrusion heat sink.
Figure 9:
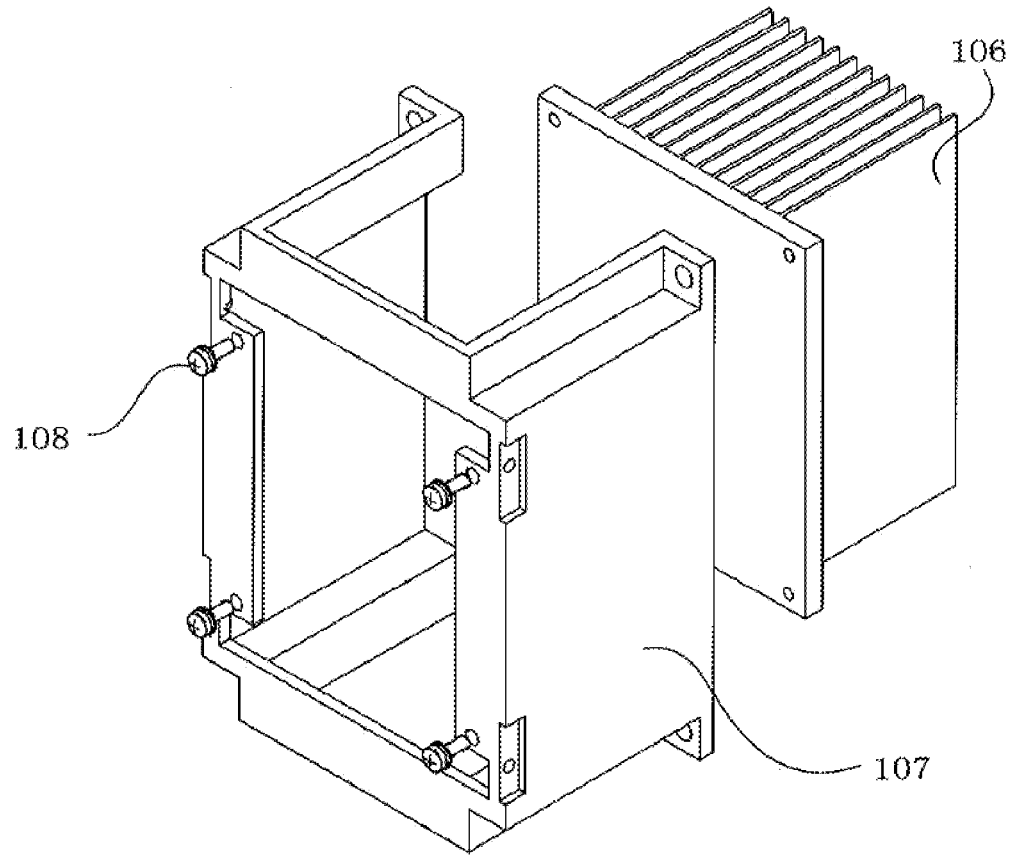
FIG. 9 is a detail view showing an attachment configuration of the heat sink in FIG. 8.

FIG. 6 is an exploded perspective view of a motor controller showing the configuration of a fifth embodiment.

The die-casting frames 2 are made into a common shape in motor controllers whose width a varies and whose height b is common depending on a capacity difference in the motor controllers. Thereby, it is possible to reduce the kinds of parts through products series, and it is possible to reduce the costs of parts by an increase in the number of die-casting frames 2 manufactured.

INDUSTRIAL APPLICABILITY

The invention relates to a motor controller, such as an inverter device or a servo amplifier, which operates mainly by a high-voltage power supply, and particularly, to a heat sink for enhancing the radiating effect of a motor controller. By using an extrusion heat sink, reducing the number of parts, and reducing the man-hours of assembling, this heat sink can be utilized in a field where a motor controller which is inexpensive and has high cooling performance is manufactured and provided.

The invention claimed is:

1. A motor controller comprising:
   an extrusion heat sink,
   a power semiconductor module which is brought into close contact with the extrusion heat sink, and
   a printed circuit board to which the power semiconductor module is connected, wherein
   at least two of die-casting frames are respectively provided on both ends of the extrusion heat sink, the die-casting frames being separated from one another.

2. The motor controller according to claim 1, wherein the die-casting frames comprise a pedestal for attaching a motor controller, and bosses for attaching a printed circuit board.

3. The motor controller according to claim 1, wherein the die-casting frames are attached to the extrusion heat sink by press fitting or caulking.

4. The motor controller according to claim 1, wherein the die-casting frames and a plastic case are provided with engaging portions for attaching the plastic cases to the die-casting frames.

5. The motor controller according to claim 4, wherein the engaging portions are latches provided in the die-casting frames and attaching holes provided in the plastic case.

6. The motor controller according to claim 1, wherein the die-casting frames to be applied to a plurality of models of motor controllers are made into a common shape.

7. The motor controller according to claim 1, wherein the die-casting frames are made into a shape common to motor controllers whose heights are equal and whose widths are different.

* * * * *